United States Patent [19]  [11] 4,241,314
Iwamatsu  [45] Dec. 23, 1980

[54] TRANSISTOR AMPLIFIER CIRCUITS

[75] Inventor: Masayuki Iwamatsu, Hamamatsu, Japan

[73] Assignee: Nippon Gakki Seizo Kabushiki Kaisha, Hamamatsu, Japan

[21] Appl. No.: 960,908

[22] Filed: Nov. 15, 1978

[30] Foreign Application Priority Data
Nov. 24, 1977 [JP] Japan .................... 52-157546[U]

[51] Int. Cl.³ ............................................. H03F 3/45
[52] U.S. Cl. ................................. 330/253; 330/300
[58] Field of Search ............... 330/252, 253, 257, 300

[56] References Cited
U.S. PATENT DOCUMENTS
3,959,733  5/1976  Solomon et al. .................... 330/253

Primary Examiner—James B. Mullins
Attorney, Agent, or Firm—Townsend & Townsend

[57] ABSTRACT

In a transistor amplifier circuit of the type wherein two pairs of circuits are used each including a source follower type field effect transistor in the input stage and a bipolar type transistor in the succeeding stage and wherein the paired bipolar transistors constitute a differential amplifier, a plurality of constant current sources are connected such that the sum of the currents flowing through respective transistors will be constant for the purpose of driving the field effect transistors with small voltage in an active region.

2 Claims, 2 Drawing Figures

TRANSISTOR AMPLIFIER CIRCUITS

BACKGROUND OF THE INVENTION

The invention relates to a transistor amplifier circuit, and more particularly a transistor amplifier circuit in which a pair of circuits are used each including a source follower type field effect transistor in the input stage and a bipolar transistor in the succeeding stage and wherein the pair of bipolar transistors comprise a differential amplifier.

As shown by an amplifier circuit A shown in FIG. 1, in a prior art amplifier circuit of this type, the input stage is constituted by a source follower circuit including a pair of N channel field effect transistors $Q_{11}$ and $Q_{12}$ and resistors 11 and 12 and the succeeding stage is constituted by a differential amplifier circuit including a pair of PNP type bipolar transistors $Q_{13}$ and $Q_{14}$, resistors 13 and 14 and a constant current circuit $CC_{11}$, in which the gate electrodes of the field effect transistors $Q_{11}$ and $Q_{12}$ are used as the input terminals, while the collector electrodes of the bipolar transistors $Q_{13}$ and $Q_{14}$ are used as the output terminals, of the amplifier circuit A. By this construction, the advantages of the field effect transistors and of the bipolar transistors can be manifested namely, the advantage of high input impedance caused by the use of the field effect transistors and the advantage of high gain caused by the use of bipolar transistors can be preserved.

With the circuit construction described above, however, since the dynamic range of the input stage is determined by the voltage across the drain and source electrodes of each field effect transistor the drain-source voltage must exceed a minimum value, which is relatively high. When the field effect transistors are driven by a relatively high voltage, their loss becomes high and the gate leakage current also increases, thus increasing the power loss of the amplifier circuit. For this reason, when this circuit is used as a DC amplifier, a relatively large loss caused by over-heating produces a drift of the operating current in each field effect transistor as the temperature varies. Large gate leakage current results in small input impedance of the field effect transistor so that it is impossible to use a plurality of parallel connected field effect transistors for the purpose of increasing the gain. In addition, in this circuit as the drain-gate voltage in the field effect transistor varies in accordance with the amplitude of the input signal, the capacitance between the drain and gate electrodes and the gate leakage current of the field effect transistor also vary in accordance with the amplitude. In other words, the input impedance on the side of the gate electrode varies thereby causing distortion of the signal. Even when this circuit is incorporated into a negative feedback amplifier the distortion due to the change of input impedance of the amplifier can not be improved by negative feedback.

SUMMARY OF THE INVENTION

Accordingly, it is the principal object of this invention to provide a transistor amplifier circuit utilizing source follower type field effect transistors having a small power loss as the input stage and a differential amplifier circuit constituted by bipolar transistors as the succeeding stage.

Another object of this invention is to provide an improved transistor amplifier circuit capable of greatly decreasing the drift caused by temperature variations.

A further object of this invention is to provide a novel transistor amplifier circuit wherein it is possible to connect in parallel a plurality of pairs of field effect transistors in the input stage for the purpose of increasing the gain.

Still further object of this invention is to provide an improved transistor amplifier circuit capable of decreasing signal distortions caused by the variation in the input impedance on the side of the gate electrode of the field effect transistor in the input stage.

According to this invention, these and further objects can be accomplished by providing a transistor amplifier circuit of the type wherein two pairs of circuits are provided, each including a source follower type field effect transistor in an input stage and a bipolar transistor in a succeeding stage, and wherein the paired bipolar transistors constitute a differential amplifier, characterized in that there are provided a first constant current source with one terminal connected to first current electrodes of both field effect transistors and the other terminal connected to a first power source, second and third constant current sources having one terminal connected to a second current electrode of an associated one of the field effect transistors and another terminal commonly connected to a second power source; first and second resistors each having one terminal respectively connected to the collector electrode of an associated one of the bipolar transistors and the another terminal commonly connected to the second power source; a third resistor with one terminal commonly connected to the emitter electrodes of the bipolar transistors and the other terminal connected to the junction between the first current electrodes of the field effect transistors and the first constant current source; and means for connecting the base electrode of the bipolar transistors to the second current electrode of an associated one of the field effect transistors, respectively.

DESCRIPTION OF THE PREFERRED EMBODIMENT

Figure 1:
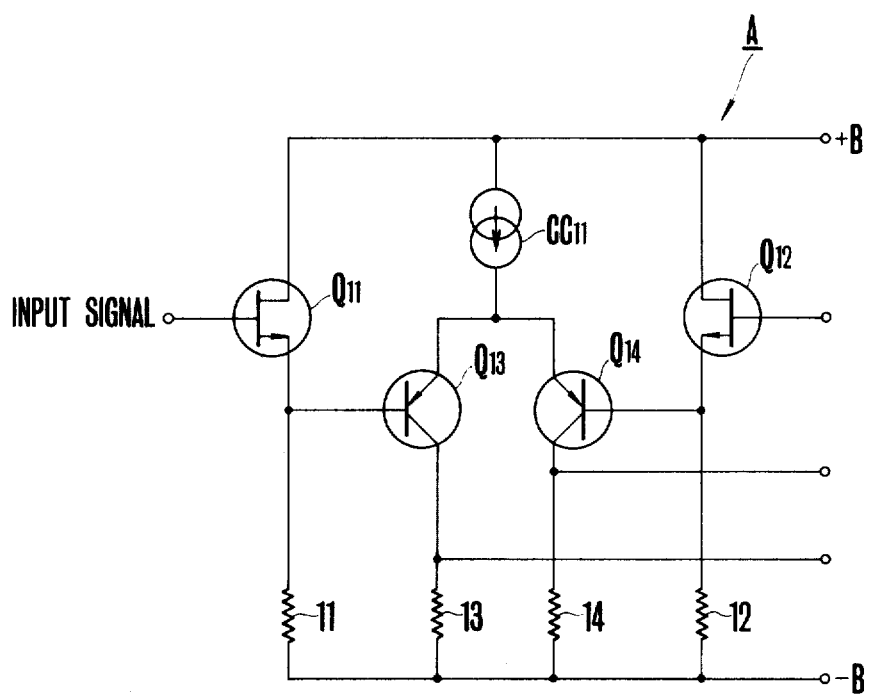
FIG. 1 is a connection diagram showing one example of a prior art transistor amplifier circuit.
Figure 2:
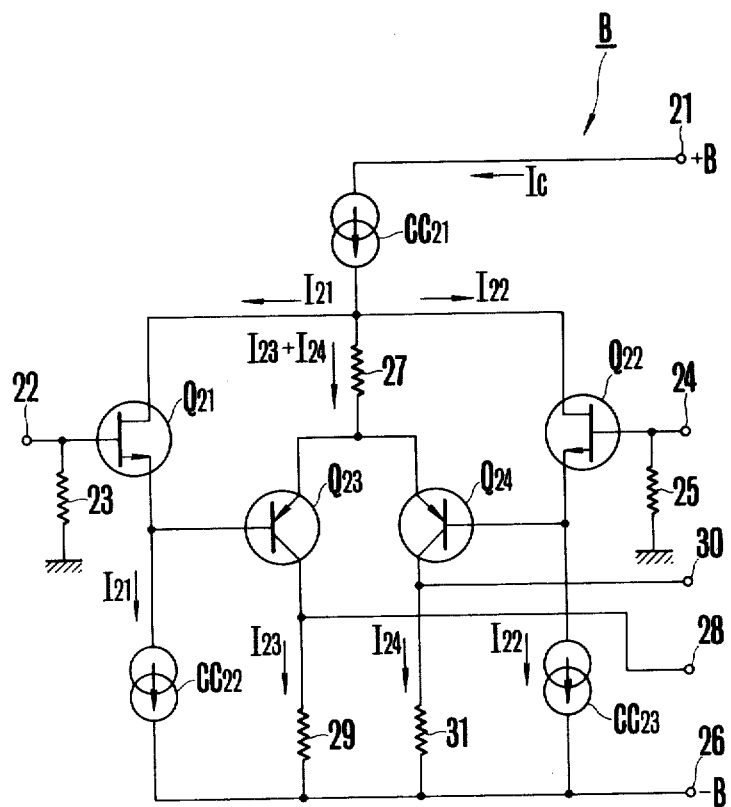
FIG. 2 is a connection diagram showing one embodiment of the transistor amplifier circuit embodying the invention.

A preferred embodiment of the amplifier circuit B shown in FIG. 2 is of the source follower type in which the input stage is constituted by a pair of N channel field effect transistors $Q_{21}$ and $Q_{22}$ and the subsequent stage is constituted by a differential amplifier circuit comprising a pair of PNP type bipolar transistors $Q_{23}$ and $Q_{24}$. The drain electrodes of the field effect transistors $Q_{21}$ and $Q_{22}$ are connected together and then connected to the positive terminal 21 of a source through a constant current source $CC_{21}$. The gate electrode of the field effect transistor $Q_{21}$ is connected to a first input terminal 22 and to the ground through a resistor 23. The source electrode of the field effect transistor $Q_{21}$ is connected to the base electrode of the bipolar transistor $Q_{23}$ and to the negative terminal 26 of the source through a constant current source $CC_{22}$. The gate electrode of the field effect transistor $Q_{22}$ is connected to a second input terminal 24 and to the ground through a resistor 25. The source electrode of the field effect transistor $Q_{22}$ is connected to the base electrode of the bipolar transistor $Q_{24}$ and to the negative terminal 26 via a constant current circuit $CC_{23}$. The emitter electrodes of bipolar transistors $Q_{23}$ and $Q_{24}$ are connected together and then connected through a resistor 27 to the junction between the drain electrodes of the field effect transistors $Q_{21}$ and $Q_{22}$ and the constant current source $CC_{21}$. The collector electrode of the bipolar transistor $Q_{23}$ is connected to a first output terminal 28 and to the negative source terminal 26 through a resistor 29, while the collector electrode of the bipolar transistor $Q_{24}$ is connected to a second output terminal 30 and to the negative source terminal 26 through a resistor 31. The resistors 23 and 25 are to set the input impedance of the amplifier B and are not essential to the present invention.

The amplifier circuit B described above operates as follows. The field effect transistors $Q_{21}$ and $Q_{22}$ in the input stage respectively operate as source follower types and their operating currents $I_{21}$ and $I_{22}$ are maintained at constant values by the constant current circuits $CC_{22}$ and $CC_{23}$ respectively. The whole circuit current $I_c$ supplied to respective transistors from the positive terminal 21 is also maintained at a constant value by the constant current source $CC_{21}$. Accordingly, the sum $(I_{23}+I_{24})$ of the currents $I_{23}$ and $I_{24}$ supplied to respective bipolar transistors $Q_{23}$ and $Q_{24}$ are shown by the following equation.

$$I_{23}+I_{24}=I_c-(I_{21}+I_{22})$$

which is maintained at a constant value irrespective of the amplitude of the input signal.

The voltage across the drain and source electrodes of the field effect transistor $Q_{21}$ is given by the sum of the voltage across the base and emitter electrodes of the bipolar transistor $Q_{23}$ and the voltage drop $(I_{23}+I_{24})R_{27}$ across the resistor 27 having a resistance value of $R_{27}$, whereas the voltage across the source and drain electrodes of the field effect transistor $Q_{22}$ is given by the sum of the voltage across the base and emitter electrodes of the bipolar transistor $Q_{24}$ and the voltage drop $(I_{23}+I_{24})R_{27}$ across the resistor $R_{27}$. As a result, the voltages across the drain and source electrodes of the field effect transistors $Q_{21}$ and $Q_{22}$ are maintained at constant values irrespective of the amplitude of the signal. Consequently, the field effect transistors $Q_{21}$ and $Q_{22}$ are driven by constant voltage so that it is possible to drive them with a small voltage. Accordingly, by setting the voltage across the drain and source electrodes of the field effect transistors at a small voltage within the active region it is not only possible to limit the loss of the field effect transistors $Q_{21}$ and $Q_{22}$ to a small value but also to decrease the gate leakage current. Since the voltage across the drain and source electrodes of the field effect transistors $Q_{21}$ and $Q_{22}$ is constant and the change in the gate-source voltage due to the input signal is negligible in magnitude relative to the drain-source voltage, the voltage across their drain and gate electrodes is also maintained at an almost constant value thus preventing variation in the capacitance between the drain and gate electrodes and the variation in the gate leakage current. The amplifier circuit B of this invention operates such that the field effect transistors $Q_{21}$ and $Q_{22}$ of the input stage operate as a buffer, while the bipolar transistors $Q_{23}$ and $Q_{24}$ produce a gain.

In the embodiment described above, since the constant current region for the drain-source voltage of field effect transistors for amplifying small signals is usually higher than 2 or 3 volts, it is advantageous to set the voltage across the drain and source electrodes of the field effect transistors to a desired small voltage near this voltage.

As can be noted from the foregoing description, according to this invention, in a transistor amplifier circuit of the type wherein field effect transistors are used in the input stage and bipolar transistors are used in the succeeding stage since the field effect transistors in the input stage are driven by a small constant voltage in an active region it is possible to limit the loss of the field effect transistors and hence their over-heating thereby preventing generation of drift caused by temperature variations. In addition, it is possible to decrease the gate leakage current of the field effect transistors and to prevent the variation in the drain-gate capacitance of the field effect transistors and variation in the gate leakage current thereby preventing distortion of the signal caused by the impedance variation on the side of the gate electrode.

What is claimed is:

1. In a transistor amplifier circuit comprising a pair of field effect transistors in an input stage having gate electrodes respectively connected to input terminals, and a differential amplifier in a succeeding stage including a pair of bipolar transistors each having a base electrode respectively connected to a first current electrode of an associated one of the field effect transistors and a collector electrode respectively connected to an associated output terminal, the improvement which comprises a first constant current source having one terminal connected to second current electrodes of said field effect transistors, and the other terminal connected to a first power source; second and third constant current sources each having a first terminal connected to said first current electrode of an associated one of said field effect transistors, and a second terminal connected to a second power source; first and second resistors each having a first terminal connected to the collector electrode of an associated one of said bipolar transistors and a second terminal connected to said second source; a third resistor having a first terminal commonly connected to the emitter electrodes of said bipolar transistors and a second terminal connected to the junction between the second current electrodes of said field effect transistors and said first constant current source.

2. A transistor amplifier circuit according to claim 1 in which the field effect transistors are of N channel type and the bipolar transistors are of PNP type.

* * * * *